United States Patent [19]

Okamoto et al.

[11] Patent Number: 4,841,470
[45] Date of Patent: Jun. 20, 1989

[54] SURFACE ACOUSTIC WAVE DEVICE FOR DIFFERENTIAL PHASE SHIFT KEYING CONVOLVING

[75] Inventors: Takeshi Okamoto; Teruo Niitsuma; Shoichi Minagawa, all of Tokyo, Japan

[73] Assignee: Clarion, Co., Ltd., Tokyo, Japan

[21] Appl. No.: 875,855

[22] Filed: Jun. 18, 1986

[30] Foreign Application Priority Data

| Jun. 25, 1985 | [JP] | Japan | 60-139968 |
| Jun. 27, 1985 | [JP] | Japan | 60-139074 |
| Jun. 27, 1985 | [JP] | Japan | 60-139075 |
| Jun. 27, 1985 | [JP] | Japan | 60-139073 |

[51] Int. Cl.$^4$ .......................... G06G 7/12; H03H 9/00
[52] U.S. Cl. ........................ 364/821; 333/193; 333/196
[58] Field of Search ............. 333/196, 154, 193, 194, 333/195; 310/313 B, 313 D; 364/821

[56] References Cited

U.S. PATENT DOCUMENTS

| 4,392,009 | 5/1986 | Masheff | 364/819 X |
| 4,635,221 | 1/1987 | Kerr | 364/821 |
| 4,675,839 | 6/1987 | Kerr | 364/821 |
| 4,691,326 | 9/1987 | Tsuchiya | 375/1 |
| 4,745,378 | 5/1988 | Niitsuma et al. | 333/196 |

Primary Examiner—Jerry Smith
Assistant Examiner—Charles B. Meyer
Attorney, Agent, or Firm—Flynn, Thiel, Boutell & Tanis

[57] ABSTRACT

A differential phase shift keying convolver having a plurality of tracks includes at least one track where an opposite phase convolution output is produced. Each track includes two output gates spaced at the center for differential phase shift keying demodulation. Among these output gates, some gates selected in accordance with the phase relationship between convolution outputs are connected to provide sum and/or difference outputs of the convolution signals. The opposite phase convolution outputs can be produced by arranging at least one of the input transducers in a step-like configuration, by using multistrip couplers, or by providing a metal film in a selected position of the traveling path of surface acoustic waves for application of a control voltage.

21 Claims, 5 Drawing Sheets

SURFACE ACOUSTIC WAVE DEVICE FOR DIFFERENTIAL PHASE SHIFT KEYING CONVOLVING

FIELD OF THE INVENTION

This invention relates to differential phase shift keying convolver (hereinafter called DPSK convolver) wherein opposed input transducers are provided on a piezoelectric substrate near both ends thereof to propagate surface acoustic waves therefrom in opposite directions through output gate means including a plurality of tracks and located between the input transducers.

BACKGROUND OF THE INVENTION

There are known some forms of surface acoustic wave convolver, i.e. (a) medium-spaces convolvers where a semiconductor and a piezoelectric material are united via a slight space therebetween, (b) elastic convolvers which use the non-linearity of a piezoelectric substrate itself, and (c) monolithic convolvers where a semiconductor substrate and a piezoelectric film deposited thereon form a laminated structure.

Medium-spaced convolvers at (a) above are inferior to others in productivity because they require a careful control of the space. Elastic convolvers at (b) above require a large surface acoustic wave energy because they utilize the elastic non-linearity of the piezoelectric substrate. However, elastic convolvers as well as laminated convolvers at (c) above, unlike medium-spaced convolvers, can be readily assembled and are good in productivity. Laminated convolvers are also excellent in convolution efficiency because they utilize the non-linearity of depletion layer capacitance in a semiconductor, and are simple in arrangement due to the monolithic structure.

FIGS. 14 and 15 are a cross-sectional view and a plan view of such a laminated structure. Reference numeral 1 designates a silicon or other semiconductor layer, 2 denotes a piezoelectric layer made from zinc oxide, aluminum nitride or other material, 3 refers to a surface acoustic wave input transducer, and 4 shows an output gate. The transducer 3 and the gate 4 are aluminum or other metal films.

It is widely known to use a surface acoustic wave convolver as a signal processing element in spread spectrum communication systems, for example. In spread spectrum communication systems, DPSK is often used for data modulation.

DPSK-modulated signals can be matched and filtered by a surface acoustic wave convolver having the construction of FIG. 16, for example. The structure of FIG. 16 is called "DPSK convolver" detailed operations of which are disclosed by D. Brodtkorb and J. E. Laynor in pages 561 through 566 of Ultrasonics Symposium Proceedings, 1978.

In FIG. 16, reference numerals 5 and 6 are spaced output gates. 7 denotes a hybrid for summing and subtracting signals from both gates 5 and 6. 8 and 9 designate hybrid outputs for outputting a sum ($\Sigma_{out}$) from 8 and a difference ($\Delta_{out}$) from 9.

Still referring to FIG. 16, when a surface acoustic wave travelling from the left-end input transducer 3 to the right, for example, reaches the right-end input transducer, it is reflected by the right-end input transducer into a surface acoustic wave travelling to the left. The reflected, leftward travelling surface acoustic wave reacts on a rightward travelling wave from the left-end input transducer to produce a convolution output. This output generates undesired waves which are called self convolution. This phenomenum is caused when the right and left input transducers are regular transducers, but may be removed by using a uni-directional transducer. However, unidirectional transducers are usually difficult in design and manufacturing. Additionally, since spread spectrum communication systems generally deal with wide band signals, unidirectional transducers must have a wide band characteristic, and this makes their design and manufacturing more difficult.

Japanese Patent Publication No. 47569/1972 discloses a surface acoustic wave device adapted to decrease undesired waves. However, the publication does not teach the use of the device as a DPSK convolver.

A spread spectrum communication receiver using the DPSK convolver of FIG. 16 is significantly expensive because it uses the hybrid 7.

OBJECT OF THE INVENTION

It is therefore an object of the invention to provide a surface acoustic wave DPSK convolver with a decreased self-convolution at a low cost.

SUMMARY OF THE INVENTION

According to the invention, there is provided a DPSK convolver using a surface acoustic wave device comprising:
 a piezoelectric substrate;
 two input transducers provided near respective ends on one surface of said substrate and opposed to each other; and
 output gate means provided between said input transducers and along the traveling path of surface acoustic waves generated from respective said input transducers toward each other to produce output gate signals which generate convolution signals of input signals entered in said input transducers.

DETAILED DESCRIPTION

Figure 1:
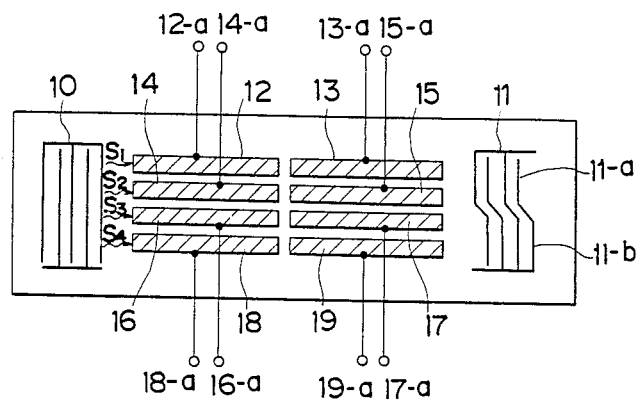
FIG. 1 shows an electrical connection on the upper surface of a DPSK convolver embodying the invention.

The invention is hereinbelow described in detail, referring to some embodiments illustrated in the drawings.

FIG. 1 shows an electrical connection on the upper surface of a 4-track DPSK convolver embodying the invention. Reference numeral 10 refers to an input transducer, 11 to a 180° stepwise input transducer, 11-a to an electrode section corresponding to tracks of output gates 12, 13, 14 and 15, and 11-b to an electrode section corresponding to tracks of output gates 16, 17, 18 and 19. Reference numerals 12-a, 13-a, 14-a, 15-a, 16-a, 17-a, 18-a and 19-a denote output terminals corresponding to the output gates 12 through 19 respectively. Reference numerals $S_1$, $S_2$, $S_3$ and $S_4$ denote surface acoustic waves traveling in respective four tracks from the input transducer 10.

The output gates 12 through 19 make four tracks between the right and left input transducers 10 and 11 and over the interdigitating width of the input transducers. More specifically, the output gates 12 and 13 form one track, the output gates 14 and 15 form a second track, the output gates 16 and 17 form a third track, and the output gates 18 and 19 form a fourth track.

Each track is divided into two parts by an interruption at the center thereof as seen between the output gates 12 and 13, for example, for the purpose of DPSK demodulation. The right-end input transducer 11, as shown in FIG. 1, has a stepwise configuration to make a 180° phase difference between upper two tracks and lower two tracks. That is, the electrode sections 11-a and 11-b of the input transducer 11 are located at positions spaced by $\lambda_0/2$. Here, $\lambda_0$ is the wavelength of a surface acoustic wave. The input transducers and output gates are made from aluminum or other metal.

In this 4-track DPSK convolver, convolution signals corresponding to input signals from the input transducers 10 and 11 are obtained from the output terminals 12-a through 19-a.

The surface acoustic waves $S_1$, $S_2$, $S_3$ and $S_4$ generated by the left-end transducer 10 travel to the right through the four tracks and reach the right end transducer 11 in a uniform phase. Since the transducer 11 comprises the electrodes 11-a and 11-b, and the electrodes are located with 180° phase difference, the surface acoustic waves entering with a uniform phase give no influence to the transducer. Surface acoustic waves generated by the right-end input transducer 11 and traveling to the left reaches the left- end transducer 10 in the same manner. These surface acoustic waves have opposite phases in the upper two and lower two tracks, and give no influence to the transducer 10. Thus, no electrical reflection occurs at the input transducers 10 and 11. Therefore, the 4-track DPSK convolver with this construction can significantly reduce the self-convolution.

Reflected waves due to electrical reflection can be reduced as described above. However, mechanical reflection may occur, depending on the property or thickness of the metal used for the transducers 10 and 11. Such a mechanical reflection, however, can be overcome by using input transducers 10 and 11 where the width of each electrode finger thereof and each spacing between adjacent fingers are $\lambda/8$ (where $\lambda$ is the wavelength of the surface acoustic waves).

As described, this structure provides a high capacity convolver which effectively decreases the self-convolution. The 4-track DPSK convolver has the following further advantages.

In FIG. 1, numbering the tracks as 1, 2, 3 and 4 in order from top to bottom, the convolution outputs from the tracks 1 and 2 and the convolution outputs from the tracks 3 and 4 are opposite in phase. The tracks 1 and 2 are uniform in phase, and the tracks 3 and 4 are also uniform in phase. This is because the electrode sections 11-a and 11-b in the right-end input transducer 11 are different in phase by 180°, and the tracks 1 and 2 corresponding to the electrode section 11-a and the tracks 3 and 4 corresponding to the electrode section 11-b are opposite in phase. Further, it is understood from FIG. 1 that the tracks 1 and 2 are in a uniform phase, and the tracks 3 and 4 are in another uniform phase. In this fashion, convolution outputs are produced from the eight output gates 12 through 19 forming 4 tracks to the terminals 12-a through 19-a respectively.

In connection with the aforegoing explanation, the phase relationship between the gate outputs is shown in Table 1, taking as a reference phase the convolution signal obtained by entering uniform-phase surface acoustic waves in the tracks 1 and 2.

TABLE 1

| Track 1 | 12-a | 13-a |
|---|---|---|
| Phase | 0 | 0 |
| Track 2 | 14-a | 15-a |
| Phase | 0 | 0 |
| Track 3 | 16-a | 17-a |
| Phase | $\pi$ | $\pi$ |
| Track 4 | 18-a | 19-a |
| Phase | $\pi$ | $\pi$ |

Figure 2:
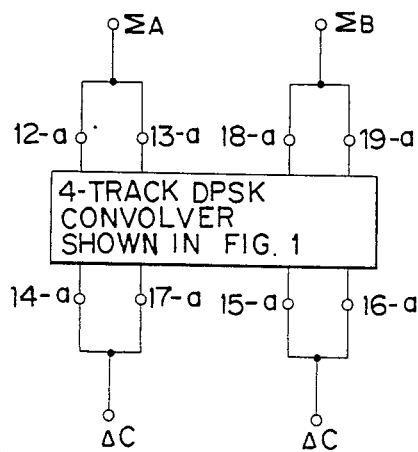
FIG. 2 shows an output electrical connection of a 4-track DPSK convolver embodying the invention.

Referring to Table 1, by connecting the convolution output terminals 12-a and 13-a a sum output A is obtained. Similarly, by connecting the output terminals 18-a and 19-a, a sum output B is obtained. However, the sum outputs A and B are different in phase by 180°. By connecting the output terminals 14-a and 17-a, a difference output C is obtained. Similarly, by connecting the output terminals 15-a and 16-a, the same difference output C is obtained. These connections are shown in FIG. 2 where $\Sigma$ is prefixed to a sum, and $\Delta$ to a difference.

As explained, either the sum outputs or difference output can be simultaneously obtained in the DPSK demodulation, not using a hybrid unlike the prior art. Due to the omission of expensive hybrids, the cost and mounting space of a spread spectrum receiver are significantly reduced.

Figure 3:
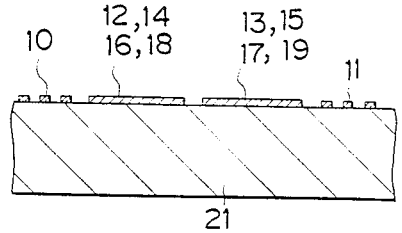
FIG. 3 is a cross-sectional view of an elastic convolver embodying the invention.

It will be easily understood that the concept of the 4-track DPSK convolver may be applied to an elastic convolver or laminated convolver. As to an elastic convolver, FIG. 3 shows that a lithium niobate or other piezoelectric substrate 21 is provided thereon with the input transducers 10 and 11 and output gates 12 through 19 all best shown in FIG. 1.

Figure 4:
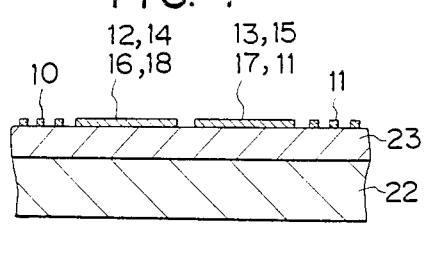
FIG. 4 is a cross-sectional view of a laminated convolver embodying the invention.

As to a laminated convolver, FIG. 4 shows that piezoelectric layer 23 made from zinc oxide or aluminum nitride is deposited on a silicon or other semiconductor substrate 22, and the input transducer 10, 11 and output gates 12 through 19 best shown FIG. 1 are provided on the piezoelectric layer 23.

Figure 5:
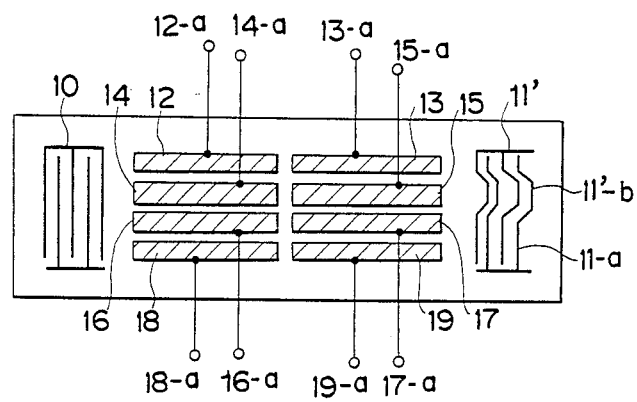
FIG. 5 is a plan view of a further 4-track DPSK convolver embodying the invention.

In the aforegoing explanation of FIG. 1, opposite-phase surface acoustic waves are entered from the right-end input transducer 11 in the upper and lower two tracks. However, the same result is obtained by entering waves from the left. Still referring to FIG. 1, for entering opposite-phase surface acoustic waves from the right-end transducer 11 in respective gates, the transducer is not limited to the stepwise configuration of FIG. 1, but may be in any other form provided opposite-phase surface acoustic waves can be entered in desired tracks. FIG. 5 shows a further stepwise configuration 11' of the right-end transducer where an electrode section 11'-b corresponding to the track 2 has a 180° phase difference from an electrode section 11'-a. The phase relationship in this case is shown by Table 2.

TABLE 2

| Track 1 | 12-a | 13-a |
|---|---|---|
| Phase | 0 | 0 |
| Track 2 | 14-a | 15-a |
| Phase | $\pi$ | $\pi$ |
| Track 3 | 16-a | 17-a |
| Phase | 0 | 0 |
| Track 4 | 18-a | 19-a |
| Phase | 0 | 0 |

Figure 6:
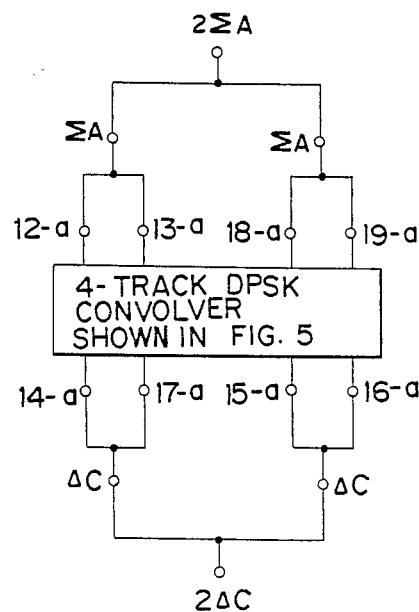
FIG. 6 shows a further output electrical connection of the 4-track DPSK convolver.

Referring to Table 2, by connecting the convolution output terminals 12-a and 13-a, a sum output A is obtained. By connecting the output terminals 18-a and 19-a, the same sum output A is obtained. Similarly, by connecting the output terminals 14-a and 17-a, a difference output C is obtained. By connecting the output terminals 15-a and 16-a, the same difference output C is obtained. These connections are shown in FIG. 6. Since these two sum outputs and difference outputs are in the same phase, a double sum output or difference output ($2\Sigma_A$, $2\Delta_C$) can be obtained by connecting them.

The aforegoing description is based on a 4-track structure. However, as apparent from FIGS. 1 and 5, also with more than four tracks, the same result is obtained by providing a phase difference in surface acoustic waves entered in respective tracks.

Figure 7:
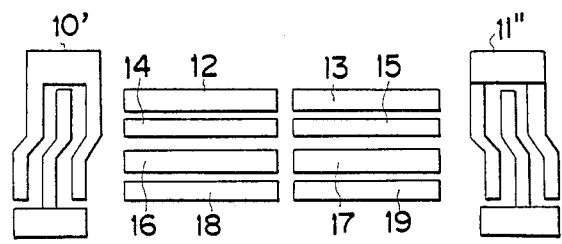
FIG. 7 shows an exemplary placement of input transducers and output gates.

In the arrangement of FIG. 1, only one of the transducers has a stepwise configuration. However, as shown in FIG. 7, both input transducers 10' and 11" may have stepwise configurations. In FIG. 7, the input transducers 10' and 11" each have a 90° phase difference between the tracks 1 and 2 and the tracks 3 and 4. Thus, with employing stepwise configurations in both input transducers, the same result is obtained.

Figure 8:
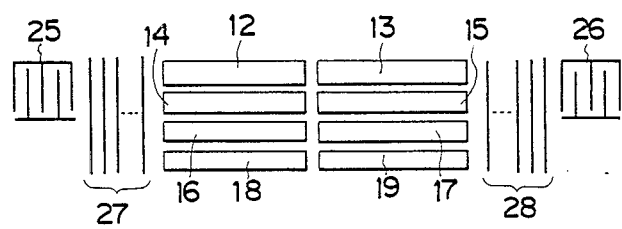
FIG. 8 shows a further exemplary placement of the input transducers and output gates.

Further, the structure of FIG. 8 where multistrip couplers 27 and 28 are provided between input transducers 25 and 26 also gives the same result. The interdigitating width of the input transducers 25 and 26 corresponds to the tracks 1 and 2. The multistrip couplers 27 and 28 function to equally share the energy of surface acoustic waves generated by the input transducers 25 and 26 to the tracks 1, 2 and tracks 3, 4 and to provide a 90° phase difference between the tracks 1, 2 and tracks 3, 4. Therefore, the same result is obtained.

Figure 9A:
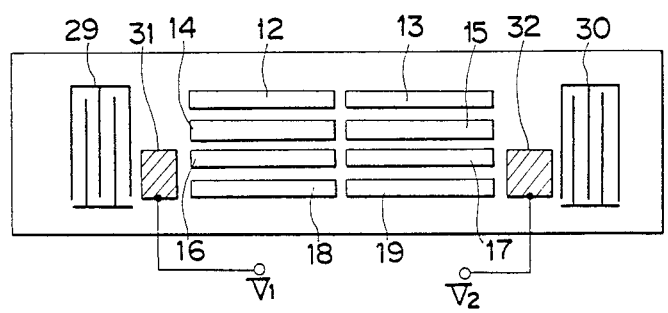
FIGS. 9(a) and 9(b) show a still further embodiment of the DPSK convolver according to the invention.
Figure 9B:
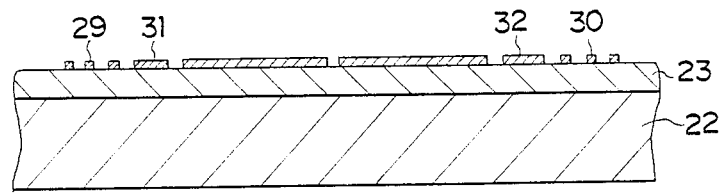

FIG. 9(a) is a plan view of a further arrangement of 4-track DPSK convolver according to the invention, nd FIG. 9(b) is a cross-sectional view of the same convolver. A piezoelectric layer 23 is provided on a semiconductor substrate 22. On the piezoelectric layer 23 are formed metal layers 31 and 32 which partly occupy the surface acoustic wave traveling path between input transducers 29, 30 and output gates 12 through 19. By applying d.c. voltages $V_1$ and $V_2$ to the metal films 31 and 32, the surface of the semiconductor 22 is changed. More specifically, by varying the control voltages $V_1$ and $V_2$, the semiconductor surface is changed between storage condition, flat-band condition, depletion condition and inverted condition, so as to desirably change the phases of surface acoustic waves in the regions of the metal films 31 and 32. Therefore, since the phases of surface acoustic waves entering in respective tracks are changed by control voltages, the same result is obtained.

Figure 10:
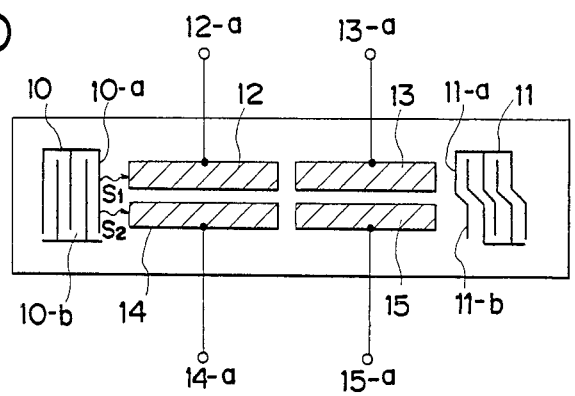
FIG. 10 shows an electrical connection on the upper surface of a yet further DPSK convolver.

FIG. 10 shows a DPSK convolver which is a further embodiment of the invention where output gates 12, 13, 14 and 15 forming two tracks are provided between right and left transducers 11 and 10 over the interdigitating width of the transducers. The output gates 12 and 13 form one track, and the output gates 14 and 15 form the other track. The right-end transducer 11 has a stepwise configuration to make a 180° phase difference between the two tracks. That is, an electrode sections 11-a and 11-b of the input transducer 11 are located at positions spaced by $\lambda_0/2$ (where $\lambda_0$ is the wavelength of a surface acoustic wave). The input transducers 10–11 and the output gates 12 through 15 are made from aluminum or other metal.

In this 2-track DPSK convolver, signals from respective output gates are obtained through output terminals 12-a, 13-a, 14-a and 15-a. Surface acoustic waves $S_1$ and $S_2$ generated by the left-end input transducer 10 and traveling to the right along respective tracks reach the right-end transducer 11 in a uniform phase. Since the transducer 11 includes the electrode sections 11-a and 11-b with 180° phase difference, the surface acoustic waves entering there with a uniform phase give no influence to the transducer.

Surface acoustic waves generated by the right-end transducer 11 and traveling to the left similarly reach the left-end transducer 10. Since these surface acoustic waves are opposite in phase in two tracks, they give no influence to the transducer 10. Thus, no electrical reflection is produced by the input transducers 10 and 11. Therefore, this 2-track DPSK convolver suppresses the self-convolution.

Figure 11:
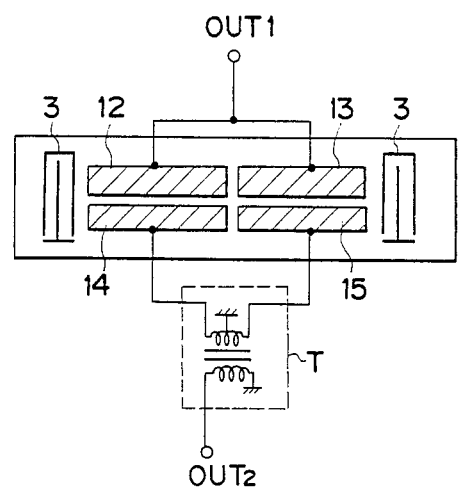
FIG. 11 shows an electrical connection on the upper surface of a yet further DPSK convolver.

FIG. 11 shows a DPSK convolver which is a still further embodiment of the invention where output gates 12, 13, 14 and 15 forming two tracks are provided between two input transducers 3—3 over the interdigitating width thereof. The output gates 12 and 13 form one track, and the output gates 14 and 15 for the other track. The input transducers 3—3 and output gates 12 through 15 are made from aluminum or other metal.

In this two-track DPSK convolver, if output gates in a single track, e.g. output gates 12 and 13, are connected, a sum output of convolution signals is obtained from a terminal OUT1, whereas by connecting output gates in the other track, e.g. output gates 14 and 15 via a balance-unbalance transformer T, a difference output of convolution signals is obtained from a terminal OUT2.

This arrangement provides a DPSK convolver with the same function, not using an expensive hybrid but using a single, inexpensive balance-unbalance transformer.

Figure 12:
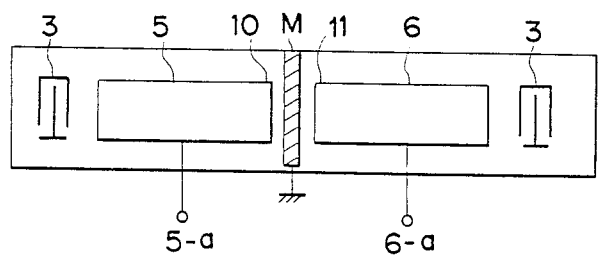
FIG. 12 is a plan view of a yet further surface acoustic wave DPSK convolver according to the invention.

FIG. 12 shows a surface acoustic wave DPSK convolver which is a yet further embodiment of the invention where two separate output gates 5 and 6 are provided between two input transducers 3—3 at both ends of the convolver. Between the output gates is provided a metal electrode M. Surface acoustic waves generated by the input transducers 3—3 undergo a non-linear effect on the gates 5 and 6 so as to produce a convolution signal of the input signals.

The metal electrode M between the gates is preferably connected to ground. The convolution signal generated between the gates is shielded by the metal electrode M. Therefore, signals caused by electromagnetic coupling between the gates 5 and 6 among signals appearing at output terminals 5-*a* and 6-*a* of the gates are suppressed so as to facilitate DPSK demodulation using the signals appearing at the output terminals 5-*a* and 6-*a*. Also, since undesired waves are decreased, a highly effective DPSK convolver is obtained.

Figure 13:
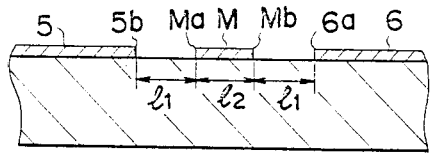
FIG. 13 is a fragmentary, enlarged cross-sectional view of a central portion of the convolver of FIG. 12.
Figure 14:
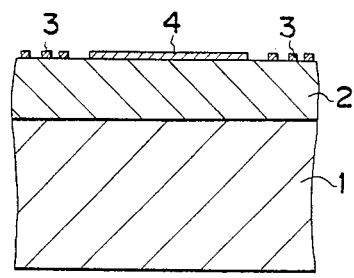
FIG. 14 is a cross-sectional view of a prior art monolithic convolver.
Figure 15:
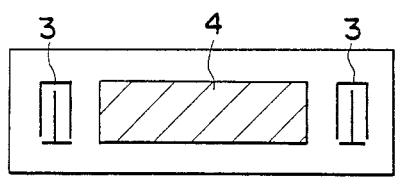
FIG. 15 is a plan view of the convolver of FIG. 14.
Figure 16:
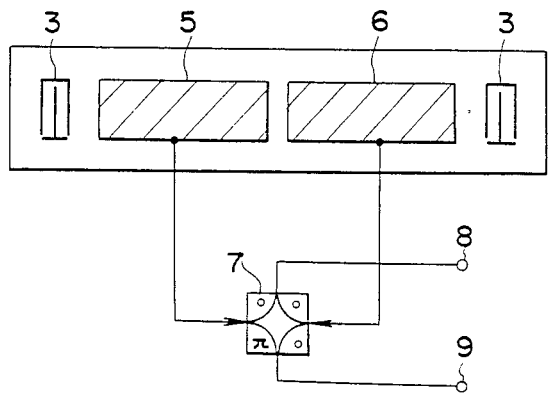
FIG. 16 is a plan view of a prior art DPSK convolver.

FIG. 13 is a fragmentary, enlarged cross-sectional view of a central portion of the device of FIG. 12. The metal electrode M has a width $l_2$, and respective output gates 5 and 6 are spaced from the metal electrode M by a distance $l_1$. When a surface acoustic wave is entered in the central portion of the convolver, it is reflected by edges 5*b* and 6*b* of the gates and by edges Ma and Mb of the metal electrode M. However, if an adequate value of the distance $l_1$ is selected, reflected waves from the respective edges 5*b*, Ma, Mb and 6*b* negate each other in a relationship expressed by:

$$l_1 = \frac{n_1}{2} \lambda_0$$

where $l_1$ is the distance between the opposed edges of the output gates, $\lambda_0$ is the wavelength of a surface acoustic wave, and $n_1$ is a positive integer.

In conclusion, the DPSK convolver according to the invention is inexpensive and small-scaled due to omission of an expensive hybrid element, and also undergoes a high efficiency due to suppression of the self-convolution by simultaneously obtaining a sum output and a difference output.

The embodiments of the invention in which an exclusive property or privilege is claimed are defined as follows:

1. A differential phase shift keying convolver comprising:
    a piezoelectric substrate;
    two input transducers provided at spaced locations on one surface of said substrate and opposed to each other, one of said transducers generating first and second surface acoustic waves which travel toward the other of said transducers along respective traveling paths and which have different phases; and
    output gate means provided between said input transducers along each said traveling path of surface acoustic waves for producing output gate signals which are a convolution of input signals generated by said input transducers, said output gate means including a plurality of pairs of output gates in which said gates of each said pair are disposed along a respective said traveling path and have therebetween a space which is located approximately in the center of the path of travel.

2. A convolver of claim 1 wherein said first surface acoustic wave is opposite in phase to said second surface acoustic wave, said convolver further including means for facilitating selective interconnection of said output gates so as to obtain sum and difference outputs of convolution signals from said output gates.

3. A convolver of claim 2 wherein said one of said input transducers has a step-shaped electrode.

4. A convolver of claim 1, wherein said other transducer generates two surface acoustic waves which have different phases and which each travel toward said one transducer along a respective said traveling path, and wherein each said input transducer includes a multistrip coupler which produces said phase difference between said surface acoustic waves generated thereby, and said convolver further including means for facilitating selective interconnection of said output gates so as to obtain sum and difference outputs of convolution signals from said output gates.

5. A convolver of claim 1, wherein said other transducer generates two surface acoustic waves which have different phases and which each travel toward said one transducer along a respective said traveling path, and wherein each said input transducer includes a metal film which is supplied with a d.c. voltage and produces said phase difference between said surface acoustic waves generated thereby, and said convolver further including means for facilitating selective interconnection of said output gates so as to obtain sum and difference outputs of convolution signals from said output gates.

6. A convolver of claim 1 wherein said one of said input transducers is configured to generate said first surface acoustic wave in an opposite phase with respect to said second surface acoustic wave.

7. A convolver of claim 1, wherein said one of said input transducers is configured to produce said first surface acoustic wave to be opposite in phase to said second surface acoustic wave, said convolver further including means for facilitating selective interconnection of said output gates so as to obtain sum and difference outputs of convolution signals from said output gates.

8. A convolver of claim 1, wherein said one of said input transducers has a step-shaped electrode.

9. A convolver of claim 1, wherein said other transducer generates two surface acoustic waves which have different phases and which each travel toward said one transducer along a respective traveling path, wherein each said input transducer includes a multistrip coupler which produces said difference in phase between said surface acoustic waves generated by such transducer, and wherein said convolver further includes means for facilitating selective interconnection of said output gates so as obtain sum and difference outputs of convolution signals from said output gates.

10. A convolver of claim 9, wherein each said multistrip coupler includes a plurality of spaced and parallel elongate metal strips on said substrate which each extend perpendicular to and across each said traveling path, and wherein each said input transducer includes an electrode which is provided on said substrate on a side of the multistrip coupler remote from said output gates and which has a dimension in a direction normal to said traveling paths which is less than the length of the metal strips of the coupler.

11. A convolver of claim 1, wherein said other transducer generates two surface acoustic waves which have different phases and which each travel toward said one transducer along a respective said traveling path, wherein each said input transducer includes a metal film which is supplied with a d.c. voltage and which produces said difference in phase between said surface acoustic waves generated by such transducer, and wherein said convolver further includes means for facilitating selective interconnection of said output gates so as to obtain sum and difference outputs of convolution signals from said output gates.

12. A convolver of claim 11, wherein each said input transducer includes an electrode which in a direction perpendicular to said traveling paths extends across each said traveling path, and wherein each said metal film is provided on one of said traveling paths and is spaced from the other of said traveling paths.

13. A convolver of claim 1, wherein said convolver further includes means for interconnecting the pair of output gates along one of said traveling paths to obtain a sum output of convolution signals from such pair of output gates, and including a balance-unbalance transformer connected to the pair of output gates along the other of said traveling paths to obtain a difference output of convolution signals from such pair of output gates.

14. A convolver of claim 1, wherein said convolver further includes a metal electrode provided on said substrate between said output gates of each said pair.

15. A convolver of claim 14, wherein said metal electrode and said output gates are configured to satisfy the equation:

$$l_1 = \frac{n_1}{2} \lambda_0$$

where $l_1$ is the distance between each end of said metal electrode and an adjacent end of a respective said output gate, $\lambda_0$ is the wavelength of a surface acoustic wave, and $n_1$ is a positive integer.

16. A convolver of claim 14, wherein said metal electrode is elongate, extends perpendicular to said traveling paths, and is grounded.

17. A convolver of claim 1, wherein said phase difference between said first and second surface acoustic waves is 180°, and wherein said other input transducer generates two surface acoustic waves which have the same phase and which each travel toward said one transducer along a respective said traveling path.

18. A convolver of claim 1, wherein said phase difference between said first and second surface acoustic waves is 90°, and wherein said other input transducer generates two surface acoustic waves which differ in phase by 90° and which each travel toward said one transducer along a respective said traveling path.

19. A differential phase shift keying convolver comprising: a piezoelectric substrate; two input transducers provided at spaced locations on one surface of said substrate and opposed to each other, one of said transducers generating first and second surface acoustic waves which travel toward the other of said transducers along respective traveling paths; and output gate means provided between said input transducers along each said traveling path of surface acoustic waves for producing output gate signals which are a convolution of input signals generated by said input transducers; wherein said output gate means includes two pairs of output gates which each form a single track, said pair of output gates of each said track being disposed along and having therebetween a space located at the center of a respective said traveling path, including means for obtaining a sum output of convolution signals from two output gates in one said track, and a balance-unbalance transformer connected to the two output gates in the other said track to obtain convolution signals from said output gates.

20. A differential phase shift keying convolver comprising: a piezoelectric substrate; two input transducers provided at spaced locations on one surface of said substrate and opposed to each other, each said input transducer generating surface acoustic waves which travel toward the other thereof along a traveling path; and output gate means provided between said input transducers along said traveling path for producing output gate signals which are a convolution of input signals generated by said input transducers; wherein said output gate means includes one pair of output gates forming a single track, said gates of said pair being disposed along and having therebetween a space located at the center of the traveling path, said convolver further including a metal electrode disposed on said substrate between said output gates.

21. A convolver of claim 20 configured to satisfy the equation:

$$l_1 = \frac{n_1}{2} \lambda_0$$

where $l_1$ is the distance between each end of said metal electrode and an adjacent end of a respective said output gate, $\lambda_0$ is the wavelength of a surface acoustic wave, and $n_1$ is a positive integer.

* * * * *